United States Patent
Yin et al.

Patent Number: 6,059,876
Date of Patent: May 9, 2000

[54] METHOD AND APPARATUS FOR GROWING CRYSTALS

[75] Inventors: Philip C. S. Yin, Centerville; Philip Edward Blosser, Beavercreek; Roger F. Jones, Wilmington, all of Ohio

[73] Assignee: William H. Robinson, Wilmington, Ohio

[21] Appl. No.: 09/019,500

[22] Filed: Feb. 5, 1998

Related U.S. Application Data

[60] Provisional application No. 60/039,299, Feb. 6, 1997.

[51] Int. Cl.⁷ .................................................. C30B 15/04
[52] U.S. Cl. .............................. 117/19; 117/20; 117/21; 117/208; 117/214; 117/932
[58] Field of Search ................................ 117/214, 932, 117/19, 20, 21, 208

[56] References Cited

U.S. PATENT DOCUMENTS

| | | | |
|---|---|---|---|
| 2,894,863 | 7/1959 | Bradshw et al. | 117/932 |
| 3,119,778 | 1/1964 | Hamilton | 117/932 |
| 3,342,560 | 9/1967 | Eckardt et al. | 117/932 |
| 3,716,345 | 2/1973 | Grabmaier | 23/301 |
| 3,804,682 | 4/1974 | Keller | 148/189 |
| 3,858,549 | 1/1975 | Keller | 118/49.1 |
| 4,200,621 | 4/1980 | Liaw et al. | 423/348 |
| 4,270,972 | 6/1981 | Crouse | 156/605 |
| 4,330,361 | 5/1982 | Kuhn-Kuhnenfeld et al. | 156/617 |
| 4,330,362 | 5/1982 | Zulehner | 156/617 |
| 4,400,232 | 8/1983 | Ownby et al. | 117/932 |
| 4,406,731 | 9/1983 | Chartier | 156/617 |
| 4,410,494 | 10/1983 | Fiegl | 422/106 |
| 4,522,791 | 6/1985 | Westphal et al. | 117/214 |
| 4,591,409 | 5/1986 | Ziem et al. | 156/605 |
| 4,650,540 | 3/1987 | Stoll | 156/618 |
| 4,704,257 | 11/1987 | Tomizawa et al. | 422/249 |
| 4,704,258 | 11/1987 | Hemmerdinger et al. | 422/254 |
| 4,824,519 | 4/1989 | Ostrogorsky | 156/617 |
| 4,873,062 | 10/1989 | Kotani et al. | 422/249 |
| 4,956,153 | 9/1990 | Yamagishi et al. | 422/249 |
| 4,957,713 | 9/1990 | Kravetsky et al. | 422/249 |
| 5,004,519 | 4/1991 | Hariri | 156/620 |
| 5,007,980 | 4/1991 | Swiggard | 156/620 |
| 5,057,287 | 10/1991 | Swiggard | 422/248 |
| 5,059,401 | 10/1991 | Watanabe et al. | 422/250 |
| 5,078,975 | 1/1992 | Rhodes et al. | 422/253 |
| 5,089,082 | 2/1992 | Dreier et al. | 156/620 |
| 5,098,674 | 3/1992 | Matsuda et al. | 422/249 |
| 5,106,593 | 4/1992 | Mizuishi et al. | 422/249 |
| 5,126,144 | 6/1992 | Kamio et al. | 422/249 |
| 5,135,887 | 8/1992 | Delage et al. | 437/106 |
| 5,139,750 | 8/1992 | Shima et al. | 422/249 |
| 5,143,704 | 9/1992 | Nakaham et al. | 422/248 |
| 5,205,997 | 4/1993 | Knowles | 422/248 |
| 5,223,077 | 6/1993 | Kaneko et al. | 156/620 |
| 5,242,531 | 9/1993 | Klingshirn et al. | 156/620 |
| 5,270,020 | 12/1993 | Suzuki et al. | 422/248 |
| 5,292,487 | 3/1994 | Tatsumi et al. | 422/249 |
| 5,312,600 | 5/1994 | Kamio et al. | 117/213 |
| 5,316,742 | 5/1994 | Tomioka et al. | 117/217 |
| 5,324,488 | 6/1994 | Klingshirn et al. | 117/213 |
| 5,370,078 | 12/1994 | Kou et al. | 117/209 |
| 5,450,814 | 9/1995 | Shiraishi et al. | 117/217 |

FOREIGN PATENT DOCUMENTS

| | | |
|---|---|---|
| 3806918A1 | 9/1989 | Germany . |
| 61-275196 | 5/1985 | Japan . |

*Primary Examiner*—Robert Kunemund
*Attorney, Agent, or Firm*—Thompson Hine & Flory LLP

[57] ABSTRACT the present invention provides an improved method and apparatus for doping silicon and other crystals made by the Czochralski process wherein the surface of the melt is partially enclosed or covered in order to capture the dopant vapors and improve the efficiency with which they are dissolved in the melt. In accordance with the invention the dopant is suspended in a vapor retention vessel such as a quartz bell jar which is suspended above the melt so that the heat from the melt causes the dopant to vaporize. In accordance with the invention, an annular baffle is provided around the mouth of the vessel or the rim of the crucible containing the melt such that the amount of uncovered open area on the surface of the melt is reduced and the dopant vapor is retained in contact with the surface of the melt such that it dissolves more efficiently in the melt.

28 Claims, 3 Drawing Sheets

METHOD AND APPARATUS FOR GROWING CRYSTALS

CROSS-REFERENCE TO RELATED APPLICATIONS

This application claims the benefit of application 60/039,299 filed Feb. 6, 1997.

BACKGROUND OF THE INVENTION

The present invention relates to an improved method and apparatus for doping silicon and other crystals grown by the Czochralski process.

Single crystalline semiconductor materials such as silicon are widely used in the electronics industry, particularly as a starting material for integrated circuits. One method of forming single crystal silicon is known as the Czochralski process. In this process, a seed crystal, which has the desired crystal orientation, is introduced into a melt of a semiconductor such as silicon. The melt is contained in a quartz or graphite crucible or vessel which is heated so that the silicon melt is at or slightly above its melting point. Crystal growth is a very sensitive process. The slightest disturbance can alter the crystal and render it unsuitable for use in integrated circuits.

In the Czochralski process, the seed crystal is slowly withdrawn from the melt in an inert atmosphere such as argon as the crystal and melt are rotated such that the silicon solidifies on the seed to produce a larger cylindrical silicon crystal called a boule or ingot. The crucible is usually rotated in the opposite direction of the crystal rotation to assure thermal balance in the growth environment. The pull rate and the power are adjusted to cause the diameter of the crystal to increase in a cone shape until the desired crystal diameter is achieved. The withdrawal rate and heating are then adjusted to maintain the desired diameter until the crystal is terminated by increasing the power and pull rate to form a cone on the end of the crystal ingot.

Certain impurities or dopants are commonly introduced to the melt for the purpose of modifying the electrical characteristics such as the resistance of the crystal. Typical dopants for silicon semiconductor crystal include arsenic, boron, antimony and red phosphorus. One method of adding dopants is to drop pellets of the dopant material into the molten material. However, this method is very inefficient because the vaporizing temperature of volatile dopants such as arsenic is substantially lower than the temperature of the melt and, as a result, a substantial amount of the dopant is lost through evaporation. Another method that has been used to dope silicon with volatile dopants such as arsenic is to suspend a quartz basket containing the dopant above the melt in an bell jar. This method is also inefficient because a large portion of the vaporized arsenic tends to flow under and out of the bell jar and does not dissolve in the silicon melt.

Accordingly, there is a need for an improved method and apparatus for doping crystals with volatile dopants such as arsenic by the Czochralski process.

SUMMARY OF THE INVENTION

The present invention provides an improved method and apparatus for doping silicon and other crystals made by the Czochralski process wherein the surface of the melt is partially enclosed or covered in order to capture the dopant vapors and improve the efficiency with which they are dissolved in the melt. In accordance with one embodiment of the invention the dopant is suspended in a vapor retention vessel such as a quartz bell jar which is suspended above the melt so that the heat from the melt causes the dopant to vaporize. In accordance with the invention, an annular baffle is provided around the mouth of the vessel or the rim of the crucible containing the melt such that the amount of uncovered open area on the surface of the melt is reduced and the dopant vapor is retained in contact with the surface of the melt such that it dissolves more efficiently in the melt. In another embodiment of the invention, the mouth of the bell jar is flared outwardly. While not desiring to be bound, flaring the mouth of the bell jar may establish an inert gas flow across the top of the melt that retains dopant where it can dissolve in the melt.

One manifestation of the invention is a method which includes the steps of providing a crucible containing the melt; suspending a vapor-retaining vessel over the surface of the melt, the vessel having a mouth which is in close proximity to the surface of the melt; suspending a dopant within the vessel above the melt; vaporizing the dopant in the vessel; providing a baffle which extends around the mouth of the vessel or flaring outwardly the mouth of the vessel to retain the vaporized dopant in contact with the surface of the melt, and dissolving the vaporized dopant in the melt. In accordance with another embodiment of the invention, instead of using a baffle, the crucible is equipped with an adjustable annular shutter or iris diaphragm that can be closed around the mouth of the vapor retention vessel to retain the vaporized dopant on the surface of the melt.

The invention also provides an apparatus for producing a silicon crystal containing a dopant comprising a vapor-retaining vessel having a mouth at its base; means for suspending a dopant in the vessel; and a baffle or flare around a mouth of the vessel to retain the vaporized dopant on the surface of the melt. In one embodiment of the invention, the baffle extends outwardly from the mouth of the vessel and in another embodiment, the baffle extends inwardly from the side wall of the crucible. In still another embodiment of the invention, the crucible is equipped with an iris shutter or diaphragm which can be closed about the mouth of the vapor retaining vessel to close off the surface of the melt extending from the mouth of the vessel to the edge of the crucible.

In another embodiment of the invention, the volatile dopant is added directly to the melt in a crucible having an iris diaphragm and the diaphragm is closed to retain the dopant in contact with the surface of the melt as it vaporizes.

Other objects and advantages of the present invention will be apparent from the following description, the accompanying drawings and the appended claims.

DETAILED DESCRIPTION

Figure 1:
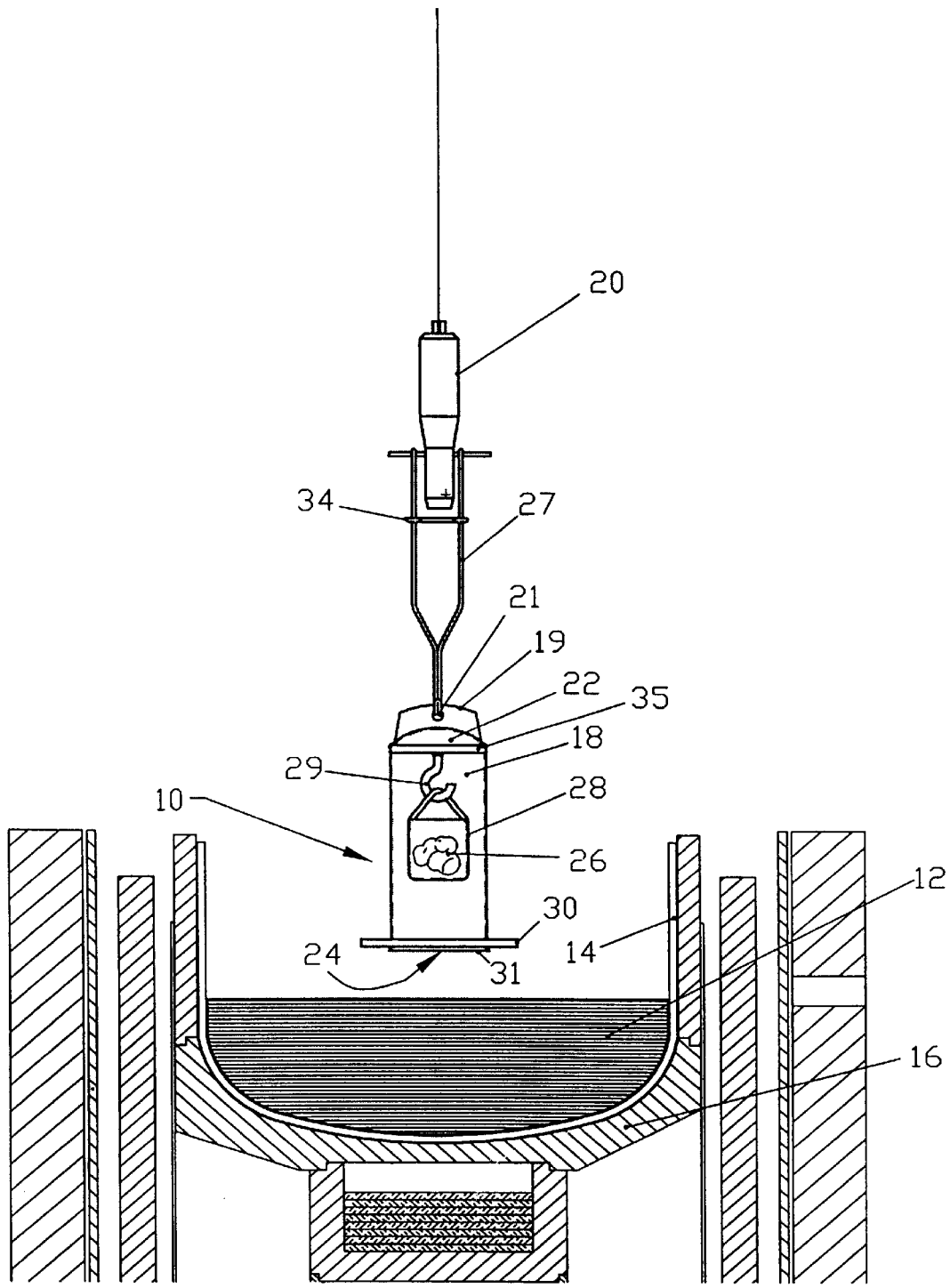
FIG. 1 is a front view of the apparatus of the present invention showing a baffle extending from a bell jar.

As shown in FIG. 1, a crystal doping apparatus generally designated 10, in accordance with the present invention includes a crucible 14 containing a molten material 12, such as silicon. The furnace, crucible and crystal pulling apparatus have a conventional construction and are commercially available from suppliers such as Liebold, Ferrofluidics, and Kayex. The crucible 14 is typically provided on a platform which is generally designated 16 such that the crucible can be raised, lowered and rotated in a manner that is conventionally used in the Czochralski process.

The doping apparatus includes a gas-retaining vessel which is preferably a quartz bell jar 18 having a closed top 22 and an open bottom 24. An upright quartz plate 19 including an aperture 21 is fused to the closed top end 22 of the bell jar so that the bell jar 18 can be suspended within the furnace on aperture 21 from a rod 20, The rod 20 can be the same rod which is used to raise and lower the seed crystal in the Czochralski process. The bell jar 18 is suspended over the melt 12 such that the mouth 24 faces downward and opens on the melt. Typically the mouth is about 0.75 to 1.25 inches above the surface of the melt. The melt is preferably 1430 degrees C. when doping silicon.

A dopant material 26, such as arsenic, is suspended in a cylindrical quartz basket or pail 28 in the bell jar 18. Preferably the basket 28 is suspended from a quartz hook 29 which is carried on a quartz rod 35 fused in place inside the closed end of the jar 18. The basket can be suspended on a molybdenum hanger 27 which includes a sliding lock bar 34. The hanger 27 is made long enough to hold the basket 28 at a height in the bell jar at which the dopant will be vaporized by the heat of the melt. By adjusting the height of the basket, the rate of vaporization of the dopant can be controlled. In doping silicon with arsenic, the dopant is preferably suspended about 4 inches above the surface of the melt.

In accordance with this embodiment of the present invention, a laterally-extending baffle is utilized in order to prevent the dopant vapors from traveling up the outer surface of the bell jar out of contact with the surface of the melt. Baffle 30 can be made from any inert and heat resistant material such as carbon, quartz or molybdenum. The baffle extends outwardly from the mouth 24 of the bell jar 18 as shown in FIG. 1. When the baffle is molybdenum, a cut is made in the baffle to permit thermal expansion. By covering the uncovered surface of the melt the baffle retains the dopant vapors near the surface of the melt where they can dissolve efficiently.

The baffle that is used on a bell jar is circular in shape and extends from the periphery of the bell jar. The size of the baffle will vary with the type and size of furnace and pull chamber in which it is used. In accordance with one embodiment of the invention the bell jar and baffle must fit through the isolation or gate valve in the furnace and the baffle is about 30 mm to 60 mm. However, the baffle can be relatively small. In fact a baffle extending as little as 6 mm from the side of the bell jar has been observed to improve dissolution of the dopant. Accordingly the baffle should be at least 6 mm wide and typically over 12 mm wide. The baffle shown in the drawing is about 40 mm wide but substantially larger baffles may be used depending upon the type of equipment that is being used to perform the process. The baffle may be formed integrally with the bell jar, or in the alternative, it may be an annular ring which sits on a bead or ledge 31 around the outer rim of the mouth 24 of the bell jar.

The use of baffle 30, improves the efficiency with which the dopant dissolves in the melt be retaining the vapors of the dopant near the surface of the melt where they can be dissolved. If the baffle is not used, the convection currents in the furnace and on the surface of the melt carry the vaporized dopant away from the surface of the melt where it is not able to dissolve in the melt.

Figure 2:
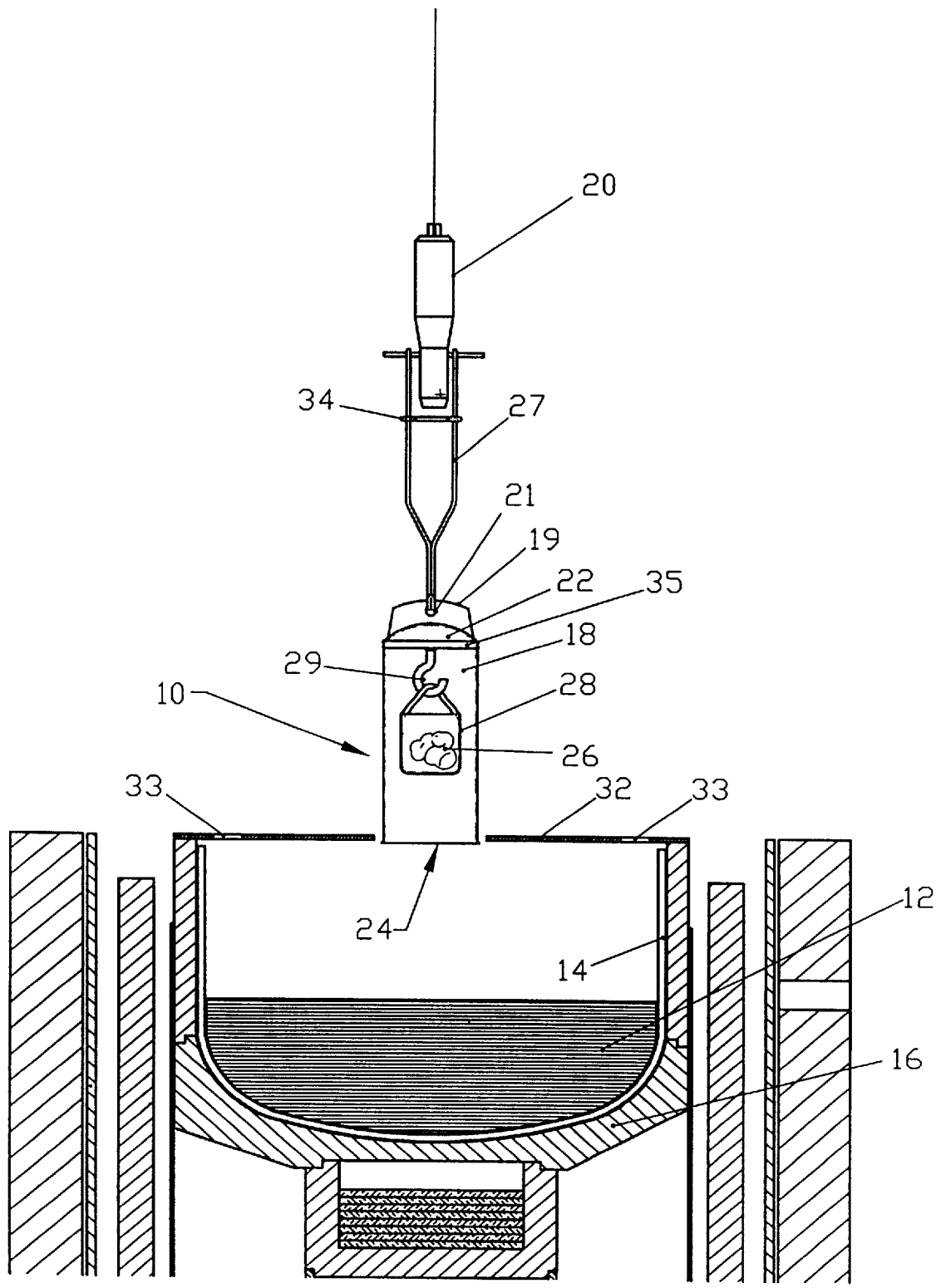
FIG. 2 is an alternate embodiment of the system of FIG. 1 wherein the baffle extends from the crucible.

In an alternative embodiment shown in FIG. 2, a laterally-extending baffle 32 extends inwardly from the upper periphery of the crucible 14. Similar to the baffle 30 in FIG. 1, baffle 32 allows less of the dopant to escape. This baffle is also circular in shape and extends from the periphery of the crucible to the edge of the bell jar. The size of the baffle will vary with the size of the hot zone. It can either be formed integrally with the crucible or be removably-attached thereto. However, the melt should not be heated in a completely closed vessel. Hence, using the design of FIG. 2, apertures 33 can be provided in the baffle 32 located at the edge of the crucible to permit off gases to escape from the melt.

Hereinabove, the invention has been described with reference to the use of a vapor retention vessel such as a bell jar. However, in another embodiment of the invention, the dopant can be added to the melt directly through a quartz doping tube in a manner that is commonly used in the art with less volatile dopants. In accordance with this embodiment of the invention, the crucible is covered using an iris diaphragm. Iris diaphragms have previously been used in the Czochralski method as a means of controlling temperature wherein they are closed around the ingot or boule during the crystal growing process. In accordance with the invention, upon doping the melt (prior to introducing the seed crystal), the iris would be closed to cover the surface of the melt and thereby retain vaporized dopant in contact with the surface such that the vaporized dopant dissolves efficiently. The iris can be closed to a small diameter opening (e.g., 2 or 3 inches in diameter) and the dopant introduced to the melt through the center of the iris. After adding the dopant, the iris can be closed further if desired. However, while it would be preferred to completely close the iris so as to minimize the open surface area of the melt, to avoid building pressures to a high level that may result in explosion or damage to the furnace, it will be desirable to leave the iris partially open or to design the iris with vents to prevent a pressure increase.

Figure 3:
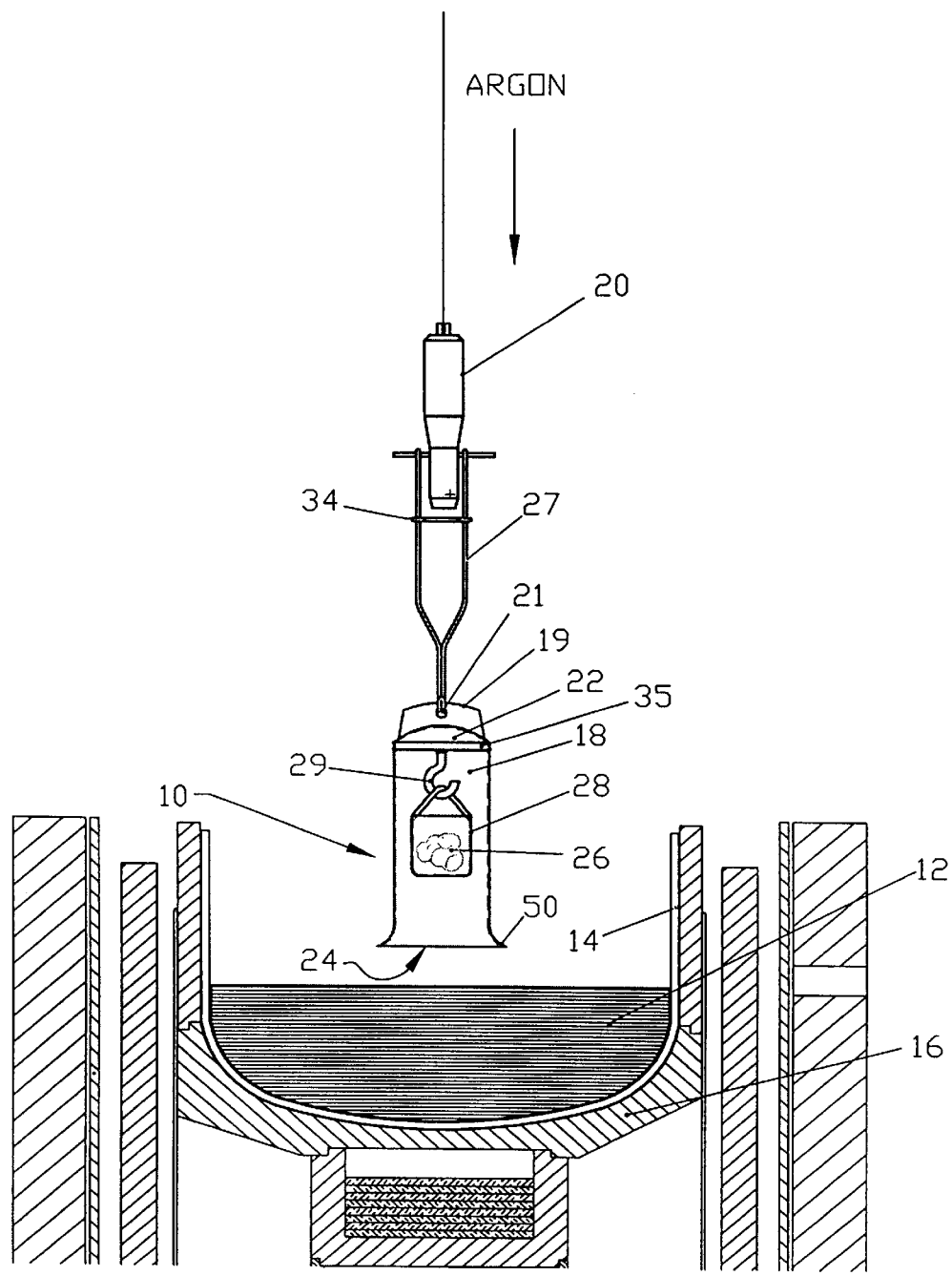
FIG. 3 is a front view of the apparatus of the invention showing a bell jar having a flared mouth in accordance with another embodiment of the invention.

In a further embodiment of the invention, a bell jar is provided in which the mouth 50 of the bell jar is flared outwardly as shown in FIG. 3. For example, the diameter of the mouth of the bell jar can be at least about 6 mm greater than the diameter of the walls of the jar above the mouth, e.g., at the vertical midpoint of the walls of the bell jar. In conventional doping apparatus, an inert gas such as argon gas is introduced from the top of the furnace chamber and drawn down into the chamber by a vacuum which is pulled from the bottom of the chamber. Flaring the mouth of the bell jar in this way is believed to produce a gas flow in the chamber which proceeds down the side of the bell jar and is directed radially outwardly by the flared mouth across the top of the melt. This flow is believed to produce a gaseous blanket which traps the dopant vapor adjacent the surface of the melt and thereby enhances dissolution. Thus, in one embodiment of the invention, a narrow baffle (e.g., 6 to 20 mm) or a flared mouth can be used to improve dissolution of the dopant. While it is believed that the improvement in dissolution is attributable to the formation of a gas blanket, the applicants do not desire to be bound by this theory. Those skilled in the art will recognize that other bell jar configurations than that illustrated in FIG. 3 can be used. The amount of flaring can vary over a wide range. For example, the wall of the bell jar could be outwardly inclined instead of being vertical and the outward inclination can start at the top of the jar or at any point intermediate the top and the mouth of the jar on the wall. Those skilled in the art will also recognize that the jar need not be circular but other polygonal cross-sections could also be employed.

While the invention has been illustrated using silicon as the melt and arsenic as an example of the dopant, those skilled in the art will recognize that the invention has application wherever the Czochralski crystal growing process is used. For example in addition to doping silicon the invention can also be used to dope other semiconductors such as gallium and germanium. The method is also useful in doping with any dopant which has a vaporization temperature which is lower than the temperature of the melt. Examples of other dopants that may be used include dopants such as red phosphorus.

Having described the invention in detail and by reference to preferred embodiments thereof, it will be apparent that modifications and variations are possible without departing from the scope of the invention defined in the appended claims.

What is claimed is:

1. A method of doping a crystal comprising the steps of:
   providing a crucible containing a melt of a crystal forming material;
   suspending a vapor retaining vessel over said melt, said vessel having an outer wall and a mouth which is adjacent the surface of said melt;
   suspending a dopant within said vessel above said melt;
   vaporizing said dopant in said vessel;
   providing a baffle which extends from the mouth of the vessel or from the perimeter of the crucible; and
   dissolving said vaporized dopant in said melt.

2. The method of claim 1 wherein said step of covering an uncovered portion of the melt includes providing a baffle which extends outwardly from and about the mouth of said vessel.

3. The method of claim 1 wherein said baffle is provided by outwardly flaring the mouth of the vessel.

4. The method of claim 1 wherein said vessel and said baffle are both made of quartz.

5. The method of claim 1 wherein said step of covering an uncovered portion of the melt includes providing a baffle which extends radially inwardly from the perimeter of said crucible.

6. The method of claim 1 wherein said step of suspending a dopant from said vessel comprises suspending said dopant in a quartz basket.

7. The method of claim 6 wherein said dopant is arsenic or red phosphorus.

8. The method of claim 1 wherein said step of covering an uncovered portion of the melt includes providing an iris diaphragm which closes over an uncovered portion of said melt.

9. The method of claim 1 wherein said step of vaporizing said dopant is conducted while directing an inert gas down the outer wall of the vapor retaining vessel.

10. The method of claim 2 wherein said baffle is at least about 6 mm wide.

11. A method of doping a crystal comprising the steps of:
    providing a crucible containing a melt of a crystal forming material having an iris diaphragm which can be closed to cover at least a portion of the surface of the melt;
    adding a dopant directly to said melt;
    closing the iris diaphragm to cover at least a portion of the surface of said melt to retain the vaporized dopant in contact with the surface of said melt; and
    dissolving said vaporized dopant in said melt.

12. The method of claim 11 wherein said crystal forming material is silicon.

13. An apparatus for producing a crystal containing a dopant comprising:
    a crucible for containing a melt of the crystal forming material;
    a vapor-retaining vessel having an outer wall and a mouth at the base of the wall, said vessel being suspended over the surface of said melt with its mouth adjacent the surface of the melt;
    means for suspending a dopant within said vessel; and
    a baffle extending from the mouth of the vessel or from the perimeter of the crucible such that no part of said baffle is in direct contact with the surface of said melt.

14. The apparatus of claim 13 wherein said apparatus includes a baffle which extends from about 30 mm to about 60 mm from said mouth of said vessel.

15. The apparatus of claim 13 wherein said vessel includes a extension around said mouth and said apparatus includes an annular baffle which sits on said extension.

16. The apparatus of claim 14 wherein said baffle is integral with said vessel.

17. The apparatus of claim 14 wherein said vessel and said baffle are both made of quartz glass.

18. The apparatus of claim 13 wherein the apparatus includes a baffle which extends radially inwardly from a perimeter of said crucible to said mouth edge of said bell jar.

19. The apparatus of claim 13 further comprising a quartz basket within said vessel and said dopant is suspended in said quartz basket.

20. The apparatus of claim 18 wherein said baffle includes apertures therein.

21. The apparatus of claim 14 wherein said apparatus additionally includes a means for introducing an inert gas into said apparatus and directing said inert gas down the wall of said vapor-retaining vessel.

22. The apparatus of claim 21 wherein said baffle is at least about 6 mm wide.

23. A method of doping a crystal comprising the steps of:
    providing a crucible containing a melt of a crystal forming material;
    suspending a vapor retaining vessel over said melt, said vessel having an outer wall and a mouth which is adjacent the surface of said melt, the mouth being outwardly flared;
    suspending a dopant within said vessel above said melt;
    vaporizing said dopant in said vessel; and
    dissolving said vaporized dopant in said melt.

24. The method of claim 1 wherein said mouth is outwardly flared such that the mouth is at least about 6 mm wider than the width of the vessel at a point removed from the mouth.

25. The method of claim 24 wherein said step of vaporizing said dopant is conducted while directing an inert gas down the wall of the vapor retaining vessel.

26. An apparatus for producing a crystal containing a dopant comprising:

a crucible for containing a melt of the crystal forming material;

a vapor-retaining vessel having an outer wall and a mouth at the base of the wall, the mouth being flared outwardly, said vessel being suspended over the surface of said melt with its mouth adjacent the surface of the melt such that no part of said mouth is in direct contact with the surface of said melt; and means for suspending a dopant within said vessel.

27. The apparatus of claim 26 wherein said apparatus additionally includes a means for introducing an inert gas into said apparatus and directing said inert gas down the wall of said vapor-retaining vessel.

28. The method of claim 27 wherein said mouth is outwardly flared such that the mouth is at least about 6 mm wider than the width of the vessel at a point removed from the mouth.

\* \* \* \* \*